US012796315B2

(12) United States Patent
Biagini et al.

(10) Patent No.: US 12,796,315 B2
(45) Date of Patent: Nov. 10, 2026

(54) PEROVSKITE-BASED SEMI-TRANSPARENT PHOTOVOLTAIC CELLS AND THE PROCESS FOR THE PREPARATION THEREOF

(71) Applicant: SUNXT S.R.L., Rome (IT)

(72) Inventors: Paolo Biagini, Novara (IT); Riccardo Po', Novara (IT); Antonella Giuri, Salice Salentino (IT); Aurora Rizzo, Lecce (IT); Silvia Colella, Bari (IT)

(73) Assignee: SUNXT S.R.L., Rome (IT)

( * ) Notice: Subject to any disclaimer, the term of this patent is extended or adjusted under 35 U.S.C. 154(b) by 0 days.

(21) Appl. No.: 18/702,164

(22) PCT Filed: Oct. 17, 2022

(86) PCT No.: PCT/IB2022/059942

§ 371 (c)(1),
(2) Date: Apr. 17, 2024

(87) PCT Pub. No.: WO2023/067474

PCT Pub. Date: Apr. 27, 2023

(65) Prior Publication Data

US 2025/0241194 A1 Jul. 24, 2025

(30) Foreign Application Priority Data

Oct. 18, 2021 (IT) ........................ 102021000026675

(51) Int. Cl.
*H10K 85/50* (2023.01)
*H10K 30/40* (2023.01)
(Continued)

(52) U.S. Cl.
CPC ............. *H10K 85/50* (2023.02); *H10K 30/40* (2023.02); *H10K 85/111* (2023.02); *H10K 85/141* (2023.02); *H10K 85/215* (2023.02)

(58) Field of Classification Search
CPC ...... H10K 30/40; H10K 30/50; H10K 85/141; H10K 85/111; H10K 85/215; H10K 85/50; H10F 19/37
See application file for complete search history.

(56) References Cited

U.S. PATENT DOCUMENTS

| | | | | |
|---|---|---|---|---|
| 2016/0079552 A1* | 3/2016 | Su | H10K 85/50 | |
| | | | 136/263 | |
| 2018/0269235 A1* | 9/2018 | Kim | H10K 85/50 | |
| 2019/0207046 A1* | 7/2019 | de Bie | H10F 19/37 | |

FOREIGN PATENT DOCUMENTS

| | | | | |
|---|---|---|---|---|
| CN | 107210373 A * | 9/2017 | H01G 9/0029 | |
| CN | 110578174 A | 12/2019 | | |

OTHER PUBLICATIONS

You et al, Low-Temperature Solution-Processed Perovskite Solar Cells with High Efficiency and Flexibility, ACS Nano 2014, 8, 2, 1674-1680. (Year: 2014).*

(Continued)

*Primary Examiner* — Andrew J Golden
(74) *Attorney, Agent, or Firm* — CANTOR COLBURN LLP

(57) ABSTRACT

A perovskite-based semi-transparent photovoltaic cell (or solar cell) wherein the photoactive layer of perovskite includes at least one polyacrylic acid in an amount greater than or equal to 3% by weight, preferably between 4% by weight and 15% by weight, more preferably between 4.5% by weight and 12% by weight, with respect to the total weight of the perovskite precursors.
The perovskite-based semi-transparent photovoltaic cell (or solar cell) can be advantageously used in various applications that require the production of electrical energy through the exploitation of light energy, especially the energy of solar radiation such as, for example: building integrated photo voltaic (BIPV); photovoltaic windows; greenhouses;
(Continued)

photo-bioreactors; noise barriers; lighting engineering; design; advertising; automobile industry. The perovskite-based semi-transparent photovoltaic cell (or solar cell) can be used both in stand alone mode and in modular systems.

10 Claims, 1 Drawing Sheet

(51) Int. Cl.
*H10K 85/10* (2023.01)
*H10K 85/20* (2023.01)

(56) References Cited

OTHER PUBLICATIONS

CN-107210373-A English machine translation (Year: 2017).*
Yuan et al, Semi-transparent perovskite solar cells: unveiling the trade-off between transparency and efficiency, J. Mater. Chem. A, 2018, 6, 19696. (Year: 2018).*
Aharon S. et al., "Self-Assembly of Perovskite for Fabrication of Semitransparent Perovskite Solar Cells" in "Advanced Materials Interfaces" (2015), vol. 2, pp. 1-6, https://doi.org/10.1002/admi.201500118.
Bag S. et al., "Efficient semi-transparent planar perovskite solar cells using a 'molecular glue'" in "Nano Energy" (2016), vol. 30, p. 542-548.
Chang C.-Y. et al., "Enhanced Performance and Stability of Semi-transparent Perovskite Solar Cells Using Solution-Processed Thiol-Functionalized Cationic Surfactant as Cathode Buffer Layer" in "Chemistry of Materials" (2015), vol. 27, p. 7119-7127.
Cho S.-P. et al., "Efficient ITO-free semitransparent perovskite solar cells with metal transparent electrodes" in "Solar Energy Materials and Solar Cells" (2019), vol. 196, p. 1-8.
Eperon G. E. et al., "Neutral Colour Semi-Transparent Micro-Structured Perovskite Solar Cells" in "ACS Nano" (2014), vol. 8, Issue 1, p. 591-598.
Fairfield et al, "Structure and chemical stability in perovskite-polymer hybrid photovoltaic materials" J. Mater. Chem. A 2019, 7, 1687-1699.
Fairfield et al, "Supporting Information for: Structure and Chemical Stability in Perovskite-Polymer Hybrid Photovoltaic Materials" Electronic Supplementary Material (ESI) for Journal of Materials Chemistry A., 2018, 18 pages.
International Search Report for International Application No. PCT/IB2022/059942, dated Jan. 23, 2023, 4 pages.
Jung et al., "High-Performance Semitransparent Perovskite Solar Cells with 10% Power Conversion Efficiency and 25% Average Visible Transmittance Based on Transparent CuSCN as the Hole-Transporting Material" Advanced Energy Materials 5 (2015) 17, pp. 1-7.
Kwon H.-C. et al., "Parallelized Nanopillar Perovskites for Semi-transparent Solar Cells Using an Anodized Aluminum Oxide Scaffold" in "Advanced Energy Materials" (2016), vol. 6, Issue 20, pp. 1-11.
Li N. et al., "Sealing the domain boundaries and defects passivation by Poly(acrylic acid) for scalable blading of efficient perovskite solar cells" in "Journal of Power Sources" (2019), vol. 426, p. 188-196.
Written Opinion for International Application No. PCT/IB2022/059942, dated Jan. 23, 2023, 4 pages.
Xue Q. et al., "Dual Interfacial Modifications Enable High Performance Semitransparent Perovskite Solar Cells with Large Open Circuit Voltage and Fill Factor" in "Advanced Energy Materials" (2017), vol. 7, Issue 9, pp. 1-9.
Zuo L. et al., "Highly Efficient Semitransparent Solar Cells with Selective Absorption and Tandem Architecture" in "Advanced Materials" (2019), vol. 31, Issue 36, pp. 1-9.
Zuo L. et al., "Polymer-modified halide perovskite films for efficient and stable planar heterojunction solar cells" in "Science Advances" (2017), vol. 3, pp. 1-11, DOI: 10.1126/sciadv.1700106.

* cited by examiner

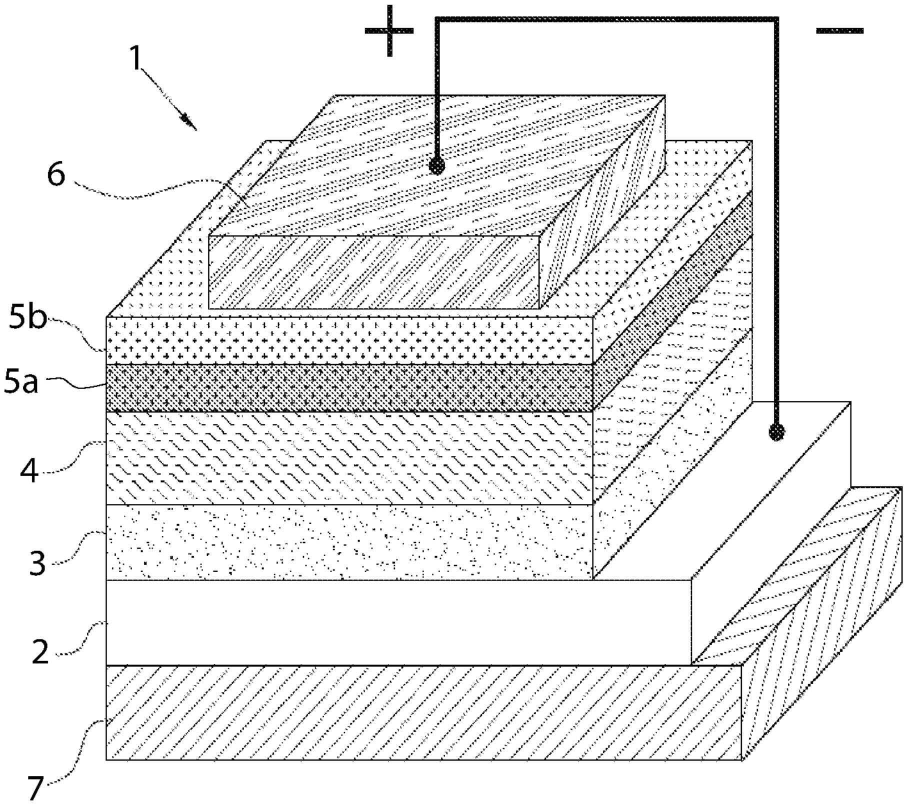
+
−
1
6
5b
5a
4
3
2
7

PEROVSKITE-BASED SEMI-TRANSPARENT PHOTOVOLTAIC CELLS AND THE PROCESS FOR THE PREPARATION THEREOF

CROSS-REFERENCE TO RELATED APPLICATIONS

This application is a 35 U.S.C. § 371 National Stage patent application of PCT/IB2022/059942, filed on 17 Oct. 2022, which claims the benefit of Italian patent application 102021000026675, filed on 18 Oct. 2021, the disclosures of which are incorporated herein by reference in their entirety.

TECHNICAL FIELD

The present disclosure relates to perovskite-based semi-transparent photovoltaic cells (or solar cells).

More specifically, the present disclosure relates to a perovskite-based semi-transparent photovoltaic cell (or solar cell) wherein the photoactive layer of perovskite comprises at least one polyacrylic acid in an amount greater than or equal to 3% by weight, preferably comprised between 4% by weight and 15% by weight, more preferably comprised between 4.5% by weight and 12% by weight, with respect to the total weight of the perovskite precursors.

Said perovskite-based semi-transparent photovoltaic cell (or solar cell) can be advantageously used in various applications that require the production of electrical energy through the exploitation of light energy, especially the energy of solar radiation such as, for example: building integrated photo voltaic (BIPV); photovoltaic windows; greenhouses; photo-bioreactors; noise barriers; lighting engineering; design; advertising; automobile industry. Said perovskite-based semi-transparent photovoltaic cell (or solar cell) can be used both in stand alone mode and in modular systems.

The present disclosure also relates to a process for the preparation of said perovskite-based semi-transparent photovoltaic cell (or solar cell).

BACKGROUND

It is known that photovoltaic cells (or solar cells) can be used in various applications that require the production of electricity by exploiting light energy such as, for example, in building integrated photo voltaic (BIPV) such as, for example, in facades, or on roofs, in greenhouses, or even in the automobile industry to cover vehicles of various sizes, characteristics and uses.

Contrary to traditional photovoltaic cells (or solar cells), where most of the efforts are dedicated to optimizing the power conversion efficiency (PCE), in photovoltaic cells or (solar cells) semi-transparent must also consider the average visible transmittance (AVT) which, in general, is calculated as a percentage of the radiation measured in the range between 400 nm and 800 nm that passes unaffected through said semi-transparent photovoltaic cells (or solar cells).

In addition, in said semi-transparent photovoltaic cells (or solar cells), another quantity is also considered, namely, the light utilisation efficiency (LUE), which is calculated according to the following formula:

$$LUE=(PCE\times AVT)/100$$

wherein:

PCE=power conversion efficiency;

AVT=average visible transmittance.

Of course, it is possible to obtain high values of light utilisation efficiency (LUE) both by using very performing photovoltaic cells (or solar cells), that is having high power conversion efficiency (PCE) but not very transparent, that is having low average visible transmittance (AVT) and using low-performing photovoltaic cells (or solar cells), that is having low power conversion efficiency (PCE) but very transparent, that is having high average visible transmittance (AVT). Therefore, photovoltaic cells (or solar cells) that may have a real practical interest must have a light utilisation efficiency (LUE)>2% obtained with a power conversion efficiency (PCE)>10% and simultaneous average visible transmittance (AVT)>20%.

Finally, a further parameter that must be considered, and which affects both traditional photovoltaic cells (or solar cells) and the semi-transparent ones, is the simplicity of the construction process, which in the future may allow for a lower cost scaling up of the technology.

Currently, most photovoltaic cells (or solar cells) available on the market are silicon based (both crystalline and amorphous). However, said photovoltaic cells (or solar cells), whilst providing interesting performances, are not very attractive from an aesthetic point of view as it is not possible to modulate their colour and, consequently, are not very suitable for use in building integrated photo voltaic (BIPV), particularly in the façades of buildings.

Some of the above problems can be overcome by using semi-transparent photovoltaic cells (or solar cells) based on organic polymers (OPV), or based on perovskitic crystalline materials (PSC). Specifically, with this latter type of photovoltaic cells (or solar cells) it is possible to choose the colour and maintain interesting properties both in terms of power conversion efficiency (PCE) and in terms of average visible transmittance (AVT). For this reason, in recent years, many studies have been carried out in order to optimize both the power conversion efficiency (PCE) and the average visible transmittance (AVT)], in perovskite-based semi-transparent photovoltaic cells (or solar cells).

For example, Eperon G. E. et al., in "*ACS Nano*" (2014), Vol. 8, Issue 1, pg. 591-598, report the manufacture of semi-transparent solar cells based on perovskite with the following layout c-$TiO_2$/perovskite ([$CH_3NH_3$]I+$PbCl_2$; 3:1)/Spiro-OMeTAD/Au, obtaining with a particular configuration a power conversion efficiency (PCE) equal to 3.5% and an average visible transmittance (AVT) equal to 26.8%, whilst with another configuration a power conversion efficiency (PCE) of 6.9% and an average visible transmittance (AVT) of 9.7%. However, it is believed that the construction process can be very complicated and hardly suitable for use in the scaling-up phase for the construction of large area semi-transparent photovoltaic cells (or solar cells), as it involves an annealing step at 500° C. to obtain the compact layer c-$TiO_2$ and furthermore the authors obtain the semitransparency of the various devices prepared through the deposition of the active layer of perovskite with islands, that is within the active area there is an alternation of areas wherein perovskitic material is present and in areas where it is not present. This particular configuration is achieved by very precisely regulating all the deposition parameters: a non-stoichiometric ratio is used between the components of the perovskite ([$CH_3NH_3$]I/$PbCl_2$), the vapour pressure of the liquid phase is varied using various solvents (dimethylsulfoxide, dimethylformamide, N-methylpyrrolidone), the annealing temperature is varied (90°

C.-130° C.) and the oxygen and humidity content present in the annealing atmosphere is varied.

Aharon S. et al., in "*Advanced Materials Interfaces*" (2015), Vol. 2, https://doi.org/10.1002/admi.201500118, report the manufacture of semi-transparent solar cells based on perovskite with the following layout: c-$TiO_2$/meso-$TiO_2$/$CH_3NH_3PbI_3$/Spiro-OMeTAD/Au, obtaining as best result, a power conversion efficiency (PCE) of 4.98% and an average visible transmittance (AVT) of 19%. Also in this case it is believed that the construction process can be very complicated and difficult to be used in the scaling-up phase for the construction of large area semi-transparent photovoltaic cells (or solar cells), as it involves three steps of annealing at 450° C.-500° C. to obtain the layers of c-$TiO_2$ and meso-$TiO_2$, furthermore the semitransparency is obtained and regulated by means of screen printing deposition of the active layer based on perovskite through a grid of variable dimensions and of controlling the concentration of the precursor solutions, the evaporation rate of the solvent, the addition of components to modify the wettability and ambient humidity.

Jung J. W. et al., in "*Advanced Energy Materials*" (2015), Vol. 5, Issue 17, 1500486, report the manufacture of semi-transparent solar cells based on perovskite with the following layout: CuSCN/$CH_3NH_3PbI_3$/PCBM/Ag, obtaining a power conversion efficiency (PCE) around 10% and an average visible transmittance (AVT) greater than or equal to 25%. However, the average visible transmittance (AVT) is certainly overestimated as the authors measure it in a range between 300 nm and 850 nm. In addition, the photoactive layer of perovskite ($CH_3NH_3PbI_3$) was deposited through a process that involves the addition of a non-solvent (i.e. toluene) to regulate the growth of the crystals. Said process is not simple to implement on a laboratory scale and can be a source of considerable irreproducibility of the results and, moreover, it is believed that it is not suitable for use in the scaling-up phase for the construction of large area semi-transparent photovoltaic cells (or solar cells).

Chang C.-Y. et al., in "*Chemistry of Materials*" (2015), Vol. 27, pg. 7119-7127, report the manufacture of semi-transparent solar cells based on perovskite with the following layout: PEDOT:PSS/$CH_3NH_3PbI_3$/$PC_{61}BM$/Ag with the use of a particular cathodic buffer layer based on alkyl ammonium salts modified with thiol groups and using an ultra-thin layer of silver as electrode, obtaining a power conversion efficiency (PCE) equal to 11.8% and an average visible transmittance (AVT) equal to 20.8% (measured in the range between 350 nm and 800 nm). The photoactive layer of perovskite was obtained through a two-step process wherein a first layer of a solution of lead iodide ($PbI_2$) in dimethylformamide (DMF) was deposited and subsequently a second layer of a solution of methylammonium iodide [($CH_3NH_3$)I] in dimethylformamide (DMF). Also in this case, it is believed that the process of obtaining the photoactive layer of perovskite can be a source of irreproducibility and difficult to be used in the scaling-up phase for the construction of large area semi-transparent photovoltaic cells (or solar cells).

Kwon H.-C. et al., in "*Advanced Energy Materials*" (2016), Vol. 6, Issue 20, 1601055, reports the manufacture of semi-transparent solar cells based on perovskite with the following layout: PEDOT:PSS/$CH_3NH_3PbI_3$/$PC_{61}BM$/Ag ct:c-$TiO_2$/AAO+perovskite ([$CH_3NH_3$] I+$PbCl_2$; 3:1)/Spiro-OMeTAD/$MoO_x$-ITO obtaining a power conversion efficiency (PCE) equal to 9.6% and an average visible transmittance (AVT) equal to 33.4% (measured in the range between 350 nm and 900 nm). Also in this case, it is believed that the construction process can be very complicated and difficult to be used in the scaling-up phase for the construction of large area semi-transparent photovoltaic cells (or solar cells), as it involves a step of annealing at 500° C. to obtain the compact layer c-$TiO_2$, a subsequent evaporation of aluminium that must be subjected to an anodization process that leads to the formation of an aluminium oxide template with pores of controlled dimensions (AAO) at the inside of which a photoactive layer of perovskite is introduced. Furthermore, the average visible transmittance (AVT) seems to be quite overestimated given the width of the range wherein it was measured.

Bag S. et al., in "*Nano Energy*" (2016), Vol. 30, pg. 542-548, report the manufacture of semi-transparent solar cells based on perovskite with the following layout: PEDOT:PSS/$CH_3NH_3PbI_3$/$PC_{71}BM$/Ag obtaining a power conversion efficiency (PCE) equal to 8.2% and an average visible transmittance (AVT) equal to 34% (measured in the range between 400 nm and 800 nm). Also in this case, it is believed that the construction process which involves the deposition of the photoactive layer of perovskite in two steps and, furthermore, to obtain the described performances, the deposition by evaporation of a very thin layer (about 5 nm) of thiourea above the PEDOT layer: PSS and a very thin layer of fullerenes ($C_{60}$) above the $PC_{71}BM$ layer, can be very complicated and difficult to be used in the scaling-up phase for the construction of large area semi-transparent photovoltaic cells (or solar cells).

Xue Q. et al., in "*Advanced Energy Materials*" (2017), Vol. 7, Issue 9, 1602333, report the manufacture of semi-transparent solar cells based on perovskite with the following layout: NIO-DEA/$CH_3NH_3PbI_3$/$C_{60}CH_2Ind$/$PN_4N$/Ag, obtaining a power conversion efficiency (PCE) equal to 11% and an average visible transmittance (AVT) equal to 25.6% (measured in the range between 380 nm and 780 nm). Also in this case, it is believed that the construction process which provides for the deposit of the photoactive layer of perovskite in two steps with the addition of a non-solvent (i.e. toluene) and, moreover, to obtain the described performances, the deposit of a very thin monomolecular diethylamine (DEA) layer on top of the NiO layer, said NiO layer being obtained by annealing at 500° C. and a very thin layer of a polymer functionalised with an amino group ($PN_4N$) (5 nm) above the $C_{60}CH_2Ind$ layer, it can be very complicated and difficult to be used in the scaling up phase for the construction of large area semi-transparent photovoltaic cells (or solar cells).

Cho S.-P. et al., in "*Solar Energy Materials and Solar Cells*" (2019), Vol. 196, pg. 1-8, report the manufacture of semi-transparent solar cells based on perovskite with the following layout: NiO/$CH_3NH_3PbI_3$/PCBM/PEIE/Cu, obtaining a power conversion efficiency (PCE) equal to 8.2% and an average visible transmittance (AVT) equal to 22% (measured in the range between 300 nm and 1000 nm and, consequently, overestimated). However, even if the construction process involves the deposition of the photoactive layer of perovskite in a single step using 2-methoxy ethanol as a solvent, since the NiO layer is obtained by annealing at 350° C., it is difficult to be used in the scaling up phase for the construction of large area semi-transparent photovoltaic cells (or solar cells).

Zuo L. et al., in "*Advanced Materials*" (2019), Vol. 31, Issue 36, 1901683, reports the manufacture of semi-transparent solar cells based on perovskite with the following layout: NiO/PSS/$FAPbBrxCl_{3-x}$/$PC_{61}BM$/$ZnO_{np}$/$ITO_{sputtered}$, obtaining a power conversion efficiency (PCE) equal to 7.5% and an average visible transmittance (AVT)

equal to 68% (measured in the range between 350 nm and 1000 nm and, consequently, overestimated). Also in this case, it is believed that the construction process that provides for the deposition of the photoactive layer of perovskite in two steps and the deposition of ITO, as a counter-electrode, through "sputtering" is difficult to be used in the "scaling-up" phase for the construction of large area semi-transparent photovoltaic cells (or solar cells).

It is also known to add polymers based on polyacrylic acid to the photoactive perovskite layer of photovoltaic cells (or solar cells) based on perovskite.

For example, Zuo L. et al., in "*Science Advances*" (2017), Vol. 3, e1700106, DOI: 10.1126/sciadv.1700106, report solar cells based on perovskite modified with the addition of various polymers including polyacrylic acid. The authors argue that due to the strong interactions between the groups present in the polymers used (in the case of polyacrylic acid the —COOH groups) and the precursors of perovskite [i.e., lead iodide ($PbI_2$) and methylammonium iodide ($CH_3NH_3I$)] it was not possible to obtain homogeneous films of photoactive material (i.e. homogeneous photoactive layer) through conventional one or two-step deposition methods. In order to solve this problem, an interdiffusion method has been developed which provides for the formation of a first mesoporous layer of lead iodide ($PbI_2$) achieved through a slow growth process after a first deposition carried out by spin coating, subsequently the mesoporous lead iodide ($PbI_2$) layer is treated with a solution of methylammonium iodide ($CH_3NH_3I$) or with a mixture of methylammonium iodide ($CH_3NH_3I$) and methylammonium chloride ($CH_3NH_3Cl$) in iso-propanol, containing the desired amount of polymer (for example, polyacrylic acid). In this way, the crystallisation of the perovskite is obtained which, occurring in the presence of the polymer (for example, polyacrylic acid), determines the presence of said polymer (for example, polyacrylic acid), within the crystalline structure. However, said process does not allow to determine the exact amount of polymer (for example, polyacrylic acid) within the photoactive layer of perovskite. The perovskite-based solar cells thus obtained have a power conversion efficiency (PCE)>19%. However, also in this case it is believed that the particular construction process of the photoactive layer is difficult to be used in the scaling-up phase. Furthermore, there is no mention of the average visible transmittance (AVT) of the perovskite-based solar cells obtained.

Li N. et al., in "*Journal of Power Sources*" (2019), Vol. 426, pg. 188-196, report the manufacture of perovskite-based solar cells wherein polyacrylic acid is added to a solution of perovskite precursors [i.e. lead iodide ($PbI_2$) and methylammonium iodide ($CH_3NH_3I$)] in dimethyl formamide, at very low concentrations, between 0.32% by weight and 1.27% by weight with respect to the total weight of said precursors of perovskite [i.e. lead iodide ($PbI_2$) and methylammonium iodide ($CH_3NH_3I$)]. The photoactive layer is obtained through the Doctor Blade technique on a preheated support at 150° C.: in this way, perovskite-based solar cells have been obtained with a power conversion efficiency (PCE) up to 14.9%. However, to achieve these results, perovskite-based solar cells also contain a layer of nickel oxide (NiO) as a hole carrier which involves an annealing step at 400° C. which makes the process construction of the photoactive layer difficult to be used in the scaling-up phase. Furthermore, also in this case, there is no mention of the average visible transmittance (AVT)] of the perovskite-based solar cells obtained.

Fairfield D. J. et al., in "*Journal of Material Chemistry A*" (2019), Vol. 7, pg. 1687-1699, report the manufacture of perovskite-based solar cells wherein polyacrylic acid or other polymers are added to a solution of perovskite precursors [i.e. lead iodide ($PbI_2$) and methylammonium iodide ($CH_3NH_3I$)] in dimethyl formamide:dimethyl sulfoxide (4:1, vol:vol), at a concentration not exceeding 2.7% by weight with respect to the total weight of said precursors of perovskite [i.e. lead iodide ($PbI_2$) and methylammonium iodide ($CH_3NH_3I$)]. The photoactive layer is obtained with a two-step process: spin coating followed by the addition of suitable quantities of non-solvents such as, for example, chlorobenzene or toluene: also in this case it is believed that the two-step production process is difficult to scale. Furthermore, the perovskite-based solar cells obtained through the aforementioned process have a power conversion efficiency (PCE) of 8.5%. The authors underline the fact that the perovskite-based solar cells obtained through the above process show a significant improvement in stability in the dark and in the presence of humidity, but do not provide any hint of average visible transmittance (AVT) of the perovskite-based solar cells obtained.

SUMMARY

From the above it is therefore evident the importance of having a perovskite-based semi-transparent photovoltaic cell (or solar cell) as well as a process for its construction suitable for use in the scaling-up phase for the construction of large area semi-transparent photovoltaic cells (or solar cells).

The Applicant therefore posed the problem of finding a perovskite-based semi-transparent photovoltaic cell (or solar cell) capable of having both a good power conversion efficiency (PCE) and a good average visible transmittance (AVT) (measured in the range between 400 nm and 800 nm), as well as a process for its construction suitable for use in the scaling-up phase for construction of large area semi-transparent photovoltaic cells (or solar cells).

The Applicant has now found a perovskite-based semi-transparent photovoltaic cell (or solar cell) wherein the photoactive layer of perovskite comprises at least one polyacrylic acid in an amount greater than or equal to 3% by weight, preferably comprised between 4% by weight and 15% by weight, more preferably comprised between 4.5% by weight and 12% by weight, with respect to the total weight of the perovskite precursors, able to have both a good power conversion efficiency (PCE) (i.e. PCE>10%) and a good average visible transmittance (AVT) (i.e., AVT>20%) (measured in the range between 400 nm and 800 nm), as well as a process for its construction which involves the deposition of the photoactive layer of perovskite in a single step without the use of a non-solvent and of deposition temperatures of the various layers below 120° C. Said process is therefore suitable for use in the scaling-up phase for the construction of large area photovoltaic cells (or solar cells). Furthermore, said perovskite-based semi-transparent photovoltaic cell (or solar cell) is able to maintain good photoelectric properties, i.e. good FF ("Fill Factor"), Voc ("Open Circuit Voltage"), Jsc ("short-circuit photocurrent density") values. Said perovskite-based semi-transparent photovoltaic cell (or solar cell) can be advantageously used in various applications that require the production of electrical energy through the exploitation of light energy, especially the energy of solar radiation such as, for example: building integrated photo voltaic (BIPV); photovoltaic windows; greenhouses; photo-bioreactors; noise barriers; lighting engineering; design; advertising; automobile industry. Furthermore, said perovskite-based semi-transparent photovoltaic cell (or solar cell) can be used both in stand alone mode and in modular systems.

Therefore, the present disclosure provides a perovskite-based semi-transparent photovoltaic cell (or solar cell) wherein the photoactive layer of perovskite comprises at least one polyacrylic acid in an amount greater than or equal to 3% by weight, preferably comprised between 4% by weight and 15% by weight, more preferably comprised between 4.5% by weight and 12% by weight, with respect to the total weight of the perovskite precursors.

For the purpose of the present description and of the following claims, the definitions of the numerical ranges always include the extremes unless otherwise specified.

For purposes of the present description and of the following claims, the term "comprising" also includes the terms "which essentially consists of" or "which consists of".

DETAILED DESCRIPTION OF THE DISCLOSURE

In accordance with a preferred embodiment of the present disclosure, said perovskite can be selected, for example, from organometallic trihalides having general formula $ABX_3$ wherein:

- A represents a monovalent organic cation such as, for example, methylammonium ($CH_3NH_3^+$), formamidinium [$CH(NH_2)_2^+$], n-butylammonium ($C_4H_{12}NH_3^+$), tetra-butylammonium ($C_{16}H_{36}N^+$), or mixtures thereof; or A represents a monovalent inorganic cation such as, for example, caesium ($Cs^+$), rubidium ($Rb^+$), potassium ($K^+$), lithium ($Li^+$), sodium ($Na^+$), copper ($Cu^+$), silver ($Ag^+$), or mixtures thereof; or mixtures thereof;
- B represents a divalent metal cation such as, for example, lead ($Pb^{2+}$), tin ($Sn^{2+}$), or mixtures thereof;
- X represents a halide anion such as, for example, iodine ($I^-$), chlorine ($Cl^-$), bromine ($Br^-$), or mixtures thereof.

In accordance with a further preferred embodiment of the present disclosure, said perovskite can be selected, for example, from: methylammonium lead iodide ($CH_3NH_3PbI_3$), methylammonium lead bromide ($CH_3NH_3PbBr_3$), methylammonium lead chloride ($CH_3NH_3PbCl_3$), methylammonium lead iodide bromide ($CH_3NH_3PbI_xBr_{3-x}$), methylammonium lead iodide chloride ($CH_3NH_3PbI_xCl_{3-x}$), formamidinium lead iodide [$CH(NH_2)_2PbI_3$], formamidinium lead bromide [$CH(NH_2)_2PbBr_3$], formamidinium lead chloride [$CH(NH_2)_2PbCl_3$], formamidinium lead iodide bromide [$CH(NH_2)_2PbI_xBr_{3-x}$], formamidinium lead iodide chloride [$CH(NH_2)_2PbI_xCl_{3-x}$], methylammonium formamidinium lead iodide [$(CH_3NH_3)_x(CH(NH_2)_2)_{1-x}PbI_3$], methylammonium formamidinium lead bromide [$(CH_3NH_3)x(CH(NH_2)_2)_{1-x}PbBr_3$], methylammonium formamidinium lead chloride [$(CH_3NH_3)_x(CH(NH_2)_2)_{1-x}PbCl_3$], methylammonium formamidinium lead iodide chloride [$(CH_3NH_3)_x(CH(NH_2)_2)_{1-x}PbI_{3-y}Cl_y$], methylammonium formamidinium lead iodide bromide [$(CH_3NH_3)_x(CH(NH_2)_2)_{1-x}PbI_{3-y}Br_y$], n-butylammonium lead iodide ($C_4H_{12}NH_3PbI_3$), tetra-butylammonium lead iodide ($C_{16}H_{36}NPbI_3$), n-butylammonium lead bromide ($C_4H_{12}NH_3PbBr_3$), tetra-butylammonium lead bromide ($C_{16}H_{36}NPbBr_3$), caesium lead iodide ($CsPbI_3$), rubidium lead iodide ($RbPbI_3$), potassium lead iodide ($KPbI_3$), caesium methylammonium lead iodide [$Cs_x(CH_3NH_3)_{1-x}PbI_3$), potassium methylammonium lead iodide [$K_x(CH_3NH_3)_{1-x}PbI_3$), caesium methylammonium lead iodide chloride [$Cs_x(CH_3NH_3)_{1-x}PbI_{3-y}Cl_y$), caesium formamidinium lead iodide [$Cs_x(CH(NH_2)_2)_{1-x}PbI_3$], caesium formamidinium lead bromide [$Cs_x(CH(NH_2)_2)_{1-x}PbBr_3$], caesium formamidinium lead iodide chloride [$Cs_x(CH(NH_2)_2)_{1-x}PbI_{3-y}Cl_y$], methylammonium tin iodide ($CH_3NH_3SnI_3$), methylammonium tin bromide ($CH_3NH_3SnBr_3$), methylammonium tin iodide bromide ($CH_3NH_3SnI_xBr_{3-x}$), formamidinium tin iodide [$CH(NH_2)_2SnI_3$], formamidinium tin iodide bromide [$CH(NH_2)_2SnI_xBr_{3-x}$], n-butylammonium tin iodide ($C_4H_{12}NH_3SnI_3$), tetra-butylammonium tin iodide ($C_{16}H_{36}NSnI_3$), n-butylammonium tin bromide ($C_4H_{12}NH_3SnBr_3$), tetra-butylammonium tin bromide ($C_{16}H_{36}NSnBr_3$), methylammonium tin lead iodide ($CH_3NH_3Sn_xPb_{1-x}I_3$), formamidinium tin lead iodide [$CH(NH_2)_2Sn_xPb_{1-x}I_3$], or mixtures thereof. Methylammonium lead iodide ($CH_3NH_3PbI_3$), formamidinium lead iodide [$CH(NH_2)_2PbI_3$], methylammonium formamidinium lead iodide chloride [$(CH_3NH_3)_x(CH(NH_2)_2)_{1-x}PbI_{3-y}Cl_y$], caesium methylammonium lead iodide [$Cs_x(CH_3NH_3)_{1-x}PbI_{3-y}Cl_y$), caesium formamidinium lead iodide chloride [$Cs_x(CH(NH_2)_2)_{1-x}PbI_{3-y}Cl_y$], are preferred. Methylammonium lead iodide ($CH_3NH_3PbI_3$) is even more preferable.

In accordance with a preferred embodiment of the present disclosure, said polyacrylic acid has general formula (I):

(I)

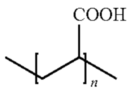

wherein n is an integer comprised between 10 and 60000, preferably comprised between 15 and 15000, more preferably comprised between 20 and 6000.

In accordance with a preferred embodiment of the present disclosure, said polyacrylic acid can have a weight average molecular weight ($M_w$) comprised between 700 Da and 4000000 Da, preferably comprised between 1000 Da and 1000000 Da, more preferably comprised between 1500 Da and 400000 Da.

In accordance with a preferred embodiment of the present disclosure, said perovskite-based semi-transparent photovoltaic cell (or solar cell) comprises:

- a glass substrate covered with a layer of transparent conductive oxide (TCO), commonly fluorine-doped tin oxide ($SnO_2$:F) (FTO), or indium tin oxide (ITO) which constitutes the anode;
- a layer base on a hole transport material (Hole Transport Layer layer—HTL), preferably a layer of poly [bis(4-phenyl(2,4,6-trimethylphenyl)amine (PTAA), or a layer of poly [bis(4-butylphenyl)bisphenylbenzidine] (Poly-TPD), or a layer of a mixture of poly(3,4-ethylenedioxythiophene) and polystyrene sulfonate (PEDOT:PSS);
- optionally a layer based on a material useful for improving the wettability, preferably a layer of poly [9,9-bis (3'-(N,N-dimethyl)-N-ethylammonium-propyl-2,7-fluorene)-alt-2,7-(9,9-dioctylfluorene)]-diodide (PFN-I), or a layer of poly [9,9-bis(3'-(N,N-dimethyl)-N-ethylammonium-propyl-2,7-fluorene)-alt-2,7-(9,9-dioctylfluorene)] (PFN);
- a photoactive layer comprising at least one perovskite, preferably methylammonium lead iodide ($CH_3NH_3PbI_3$) [methylammonium lead iodide ($CH_3NH_3PbI_3$) is the most used structure as it has a high absorption coefficient throughout the UV and visible spectrum, a band-gap equal to 1.57 eV, close to the optimal value to maximize conversion efficiency and a considerable diffusion distance of electrons and electronic holes (or holes) (over 100 nm)], and at least one polyacrylic acid, preferably a polyacrylic acid having a weight average molecular weight ($M_w$) comprised between 700 Da and 4000000 Da, preferably comprised between 1000 Da and 1000000 Da, more preferably comprised between 1500 Da and 400000 Da, even more preferably a polyacrylic acid having a weight average molecular weight ($M_w$) equal to 1800 Da;

- a layer based on an electron transport material (Electron Transport Layer—ETL), preferably a layer of [6,6]-phenyl-$C_{61}$-butyric acid methyl ester ($PC_{61}BM$);
- optionally, a layer base on a hole blocking material (Hole Blocking Layer—HBL), preferably a layer of 2,9-dimethyl-4,7-diphenyl-1,10-phenanthroline (Bathocuproine-BCP) or ethoxylated polyethyleneimine (PEIE);
- a metallic contact known as back contact which constitutes the cathode, preferably a layer of gold, silver, or metallic aluminium.

In accordance with a preferred embodiment of the present disclosure, the electrical energy generated by said at least one perovskite-based semi-transparent photovoltaic cell (or solar cell) can be transported using a wiring system which is connected with said perovskite-based semi-transparent photovoltaic cell (or solar cell).

As mentioned above, it is a further object of the present disclosure a process for the preparation of said perovskite-based semi-transparent photovoltaic cell (or solar cell).

Consequently, it is a further object of the present disclosure a process for the preparation of a perovskite-based semi-transparent photovoltaic cell (or solar cell) comprising the following steps:

(a) preparing a glass substrate covered with a transparent conductive oxide (TCO) layer (anode);

(b) depositing a layer based on a hole transport material (Hole Transport Layer—HTL) on the substrate obtained in said step (a);

(c) optionally, depositing on the layer based on a hole transport material (Hole Transport Layer—HTL) obtained in said step (b) a layer based on a material useful for improving the wettability;

(d) preparing a mixture comprising precursors of perovskite and at least one polyacrylic acid, said polyacrylic acid being present in said mixture in an amount greater than or equal to 3% by weight, preferably comprised between 4% by weight and 15% by weight, more preferably comprised between 4.5% by weight and 12% by weight, with respect to the total weight of the perovskite precursors;

(e) depositing the mixture obtained in said step (d) on the layer based on a hole transport material (Hole Transport Layer—HTL) obtained in said step (b), or on the layer based on a material useful for improving the wettability obtained in said step (c), obtaining a photoactive layer;

(f) depositing a layer based on an electron transport material (Electron Transport Layer—ETL), on the photoactive layer obtained in said step (e);

(g) optionally, depositing on the layer based on an electron transport material (Electron Transport Layer—ETL) obtained in said step (f), a layer based on a hole blocking material (Hole Blocking Layer—HBL);

(h) depositing a metal contact known as back contact which constitutes the cathode, on the layer based on an electron transport material (Electron Transport Layer—ETL) obtained in said step (f), or on the layer based on a hole blocking material (Hole Blocking Layer—HBL) obtained in said step (g);

wherein said steps (b), (c), (e), (f) and (g), are carried out at a temperature lower than 120° C., preferably comprised between 20° C. and 115° C.

For the purpose of the above process, said transparent conductive oxide (TCO), said layer based on a hole transport material (Hole Transport Layer—HTL), said layer based on an electron transport material (Electron Transport Layer—ETL), said layer based on a material useful for improving the wettability, said layer based on a hole blocking material (Hole Blocking Layer—HBL) and said metallic contact known as back contact, are chosen from those listed above.

For the purpose of the above process, said mixture comprising precursors of perovskite and at least one polyacrylic acid, comprises:

- at least one halide selected from the halides of the monovalent organic cations or the monovalent inorganic cations reported above, preferably iodides, chlorides, bromides, more preferably iodides [for example, methylammonium iodide (MAI) ($CH_3NH_3I$)], and at least one halide selected from the halides of the divalent metal cations reported above, preferably iodides, chlorides, bromides, more preferably iodides [for example, lead iodide ($PbI_2$)] as precursors of perovskite;
- at least one polyacrylic acid, preferably a polyacrylic acid having a weight average molecular weight ($M_w$) comprised between 700 Da and 4000000 Da, preferably comprised between 1000 Da and 1000000 Da, more preferably comprised between 1500 Da and 400000 Da, even more preferably a polyacrylic acid having a weight average molecular weight ($M_w$) equal to 1800 Da.

For the purpose of the above process, said steps (b), (c), (e), (f) and (g), can be carried out according to deposition techniques known in the art such as, for example, spin-coating, spray-coating, ink-jet printing, slot die coating, gravure printing, screen printing.

For the purpose of the above process, said step (h) can be carried out according to techniques known in the art such as, for example, evaporation, cathodic pulverisation, electron beam assisted deposition, sputtering, spin coating, gravure printing, flexographic printing, slot die coating.

As mentioned above, said perovskite-based semi-transparent photovoltaic cell (or solar cell) can be advantageously used in various applications that require the production of electrical energy through the exploitation of light energy, especially the energy of solar radiation such as, for example: building integrated photo voltaic (BIPV); photovoltaic windows; greenhouses; photo-bioreactors; noise barriers; lighting engineering; design; advertising; automobile industry. Furthermore, said perovskite-based semi-transparent photovoltaic cell (or solar cell) can be used both in stand alone mode and in modular systems.

Consequently, it is a further object of the present disclosure the use of said perovskite-based semi-transparent photovoltaic cell (or solar cell) in: building integrated photo voltaic (BIPV); photovoltaic windows; greenhouses; photo-bioreactors; noise barriers; lighting engineering; design; advertising; automobile industry.

The present disclosure will now be illustrated in greater detail through an embodiment with reference to FIG. 1 below.

Specifically, FIG. 1 shows a cross-sectional view of a perovskite-based semi-transparent photovoltaic cell (or solar cell) (1) comprising the following layers: a glass substrate (7) covered with a transparent conductive oxide (TCO) (anode) [e.g., indium tin oxide (ITO) or ($SnO_2$:F) (Fluorine-doped Tin Oxide—FTO) (2); a layer based on a hole transport material (Hole Transport Layer—HTL) [e.g., poly [bis(4-phenyl(2,4,6-trimethylphenyl)amine (PTAA), poly [bis(4-butylphenyl)bisphenylbenzidine] (Poly-TPD), or a mixture of poly(3,4-ethylendioxythiophene and polystyrene sulfonate (PEDOT:PSS) (3); optionally a layer based on a material useful for improving the wettability, [e.g., poly [9,9-bis(3'-(N,N-dimethyl)-N-ethylammonium-propyl-2,7-fluorene)-alt-2,7-(9,9-dioctylfluorene)]diiodide (PFN-I), or poly [9,9-bis(3'-(N,N-dimethyl)-N-ethylammonium-propyl-2,7-fluorene)-alt-2,7-(9,9-dioctylfluorene)] (PFN)] (not shown in FIG. 1); a photoactive layer comprising at least one perovskite [e.g., methylammonium lead iodide ($CH_3NH_3PbI_3$) and at least one polyacrylic acid [e.g., polyacrylic acid having a weight average molecular weight equal to 1800 Da] (4); a layer based on an electron transport material (Electron Transport Layer—ETL) [e.g., [6,6]-phenyl-$C_{61}$-butyric acid methyl ester ($PC_{61}BM$)] (5a); a layer based on a hole blocking material (Hole Blocking Layer—HBL) [e.g., 2,9-dimethyl-4,7-diphenyl-1,10-phenanthroline (Bathocuproine—BCP) or ethoxylated polyethyleneimine (PEIE)] (5b); a metallic contact known as back contact which constitutes the cathode [e.g., a layer of gold, silver or metallic aluminium] (6).

In order to better understand the present disclosure and to put it into practice, some illustrative and non-limiting examples thereof are reported below.

In the following examples, for greater simplicity, the term "solar cell" is used which is intended to have the same meaning as "photovoltaic cell".

Example 1

Preparation of a Perovskite-Based Semi-Transparent Solar Cell

For this purpose, a perovskite-based solar cell was prepared on a glass substrate coated with ITO ("Indium Tin Oxide") (Kintec KT18086-1) and patterned (dimensions 15×15×1 mm; sheet resistance equal to 12 $\Omega/cm^2$) previously subjected to a cleaning process consisting of a manual cleaning, wiping with a lint-free cloth soaked in a detergent diluted with deionised water. The substrate was then rinsed with deionised water. Subsequently, the substrate was thoroughly cleaned using the following sequential methods: ultrasonic baths in (i) deionised water plus detergent (followed by manual drying with a lint-free cloth; (ii) distilled water [followed by manual drying with a lint-free cloth]; (iii) acetone (Aldrich) and (iv) iso-propanol (Aldrich) in sequence. Specifically, the substrate was placed in a beaker containing the solvent, placed in an ultrasonic bath, maintained at 40° C., for a treatment of 10 minutes. After treatments (iii) and (iv), the substrate was dried with a stream of compressed nitrogen.

Subsequently, the glass/ITO was further cleaned by treatment in an ozone device (UV Ozone Cleaning System EXPO3—Astel), immediately before proceeding to the next step.

The substrate thus treated was ready for the deposition of the layer based on a hole transport material (Hole Transport Layer—HTL). For this purpose, a solution of poly [bis(4-phenyl) (2,4,6-trimethyl)amine (PTTA) (Aldrich) in toluene (purity 99.5%-Aldrich) at a concentration equal to 1.5 mg/ml, was deposited, through spin coating, operating at a rotation speed equal to 6000 rpm (acceleration equal to 500 rpm/s), for 30 seconds: everything was subjected to heat treatment (annealing), at 100° C., for 10 minutes. The thickness of the layer based on a hole transport material (Hole Transport Layer—HTL) was found to be equal to 40 nm.

A material useful for improving the wettability was deposited on the substrate thus obtained. For this purpose, a solution of poly [(9,9-bis (3'-(N,N-dimethylamine) propyl)-2,7-fluorene)-alt-2,7-(9,9-dioctylfluorene)] (PFN) (Aldrich) in methanol (purity 99.5%-Aldrich) at a concentration of 0.1 mg/ml, was deposited by spin coating operating at a rotation speed equal to 5000 rpm (acceleration equal to at 1000 rpm/s), for 40 seconds, then everything was subjected to heat treatment ("annealing"), at 100° C., for 5 minutes.

Subsequently, the substrate obtained was placed in a dry box and the layer of methylammonium lead iodide ($CH_3NH_3PbI_3$) and polyacrylic acid (PAA) was deposited on top of the layer based on a material useful for improving the wettability, operating as follows. For this purpose, lead iodide ($PbI_2$) (purity 99.9985%-Alfa Aesar) (350.5 mg-0.76 mmoles), methylammonium iodide (MAI) ($CH_3NH_3I$) (GreatCell Solar) (120.8 mg-0.76 mmoles) and polyacrylic acid (PAA) (weight average molecular weight ($M_w$)=1800 Da (Aldrich) (47.1 mg), were dissolved in anhydrous dimethyl sulfoxide (purity 99.9%-Aldrich) (1 ml), operating under stirring, at a temperature of 80° C., for 3 hours, obtaining a solution containing 30% by weight of perovskite precursors and 2.9% by weight of polyacrylic acid (PAA), i.e. 10% by weight of polyacrylic acid (PAA) with respect to the total weight of the other solid components (i.e. lead iodide ($PbI_2$)+methylammonium iodide (MAI) ($CH_3NH_3I$). The solution thus obtained was deposited on said layer based on a material useful for improving the wettability, by means of spin coating operating at a rotation speed equal to 5000 rpm (acceleration equal to 1000 rpm/s), for 20 seconds and everything was subjected to thermal treatment (annealing), at 100° C., for 15 minutes. The thickness of the perovskite and polyacrylic acid (PAA) layer was found to be 182 nm.

The substrate thus obtained was ready for the deposition of the layer based on an electron transport material (Electron Transport Layer—ETL). For this purpose, a filtered solution of [6,6]-phenyl-$C_{61}$-butyric acid methyl ester ($PC_{61}BM$) (Nano-C Products) (25 mg) in anhydrous chlorobenzene (purity 99.8%—Aldrich) (1 ml), was deposited, by spin coating, operating at a rotation speed equal to 1000 rpm (acceleration equal to 500 rpm/s), for 60 seconds: the substrate obtained was left to rest, at room temperature (25° C.), for 10 minutes. The thickness of the layer based on an electron transport material ("Electron Transport Layer"—HTL) was found to be equal to 50 nm.

The substrate thus obtained was ready for the deposition of the layer based on a hole blocking material (Hole Blocking Layer—HBL). For this purpose, a solution of 2,9-dimethyl-4,7-diphenyl-1,10-phenatroline (Bathocuproine-BCP) (purity 96%-Aldrich) (9 mg) in anhydrous iso-propyl alcohol (purity 99.5%-Aldrich) (18 ml) obtained by operating under stirring at 80° C., for 3 hours, was deposited, by spin coating operating at a rotation speed equal to 6000 rpm (acceleration equal to 1000 rpm/s), for 20 seconds, the substrate obtained was left to rest, at room temperature (25° C.), for 5 minutes. The thickness of the layer based on a hole blocking material (Hole Blocking Layer—HBL) material was found to be 5 nm.

Subsequently, the back contact (cathode) in metallic aluminium (Al) was deposited on top of said layer based on a hole blocking material (Hole Blocking Layer—HBL), through evaporation. For this purpose, a Kurt J. Lesker evaporator was used, operating at a pressure of $2\times10^{-6}$ mmHg and at a speed of 0.1 Angstrom/see, suitably masking the area of the solar cell in order to obtain an area active equal to 4 $mm^2$. The thickness of the back contact (cathode) in metallic aluminium (Al) was found to be equal to 50 nm.

The thicknesses were measured by scanning electron microscopy using a Jeol 7600f scanning electron microscope (SEM), equipped with a field emission electron gun, operating with accelerating voltage between 1 kV and 5 kV, and exploiting the signal coming from secondary electrons.

The electrical characterisation of the perovskite-based semi-transparent solar cell thus obtained was carried out at room temperature (25° C.). The current-voltage (J-V) density curves were acquired with a Keithley® 2400 digital multimeter connected to a personal computer for data collection. The photocurrent was measured by exposing the solar cell to the light of a Newport 91160A solar simulator (Newport Corp), placed at a distance of 10 mm from said semi-transparent solar cell, equipped with a 300 W Xenon light source, using a spot of illumination equal to 100 mm×100 mm: in Table 1, the characteristic parameters are reported as average values.

The intensity of the light was calibrated with a standard silicon solar cell ("VLSI Standard"-SRC-100-RTD-KG5).

Furthermore, said perovskite-based semi-transparent solar cell was subjected to the measurement of the average visible transmittance (AVT) (i.e. AVT>20%), measured in the range comprised between 400 nm and 800 nm, using a UV-vis spectrophotometer (VarianAU/DN^MS-100s): the measurement was carried out both on the complete perovskite-based semi-transparent solar cell, and on the perovskite-based semi-transparent solar cell before deposition of the metallic aluminium (Al) back contact (cathode): in Table 1, the results obtained are reported as average values.

Specifically, Table 1 shows the following, in order: the number of the reference example; the composition of the photoactive layer based on perovskite and polyacrylic acid (PAA); FF (Fill Factor); Voc (Open Circuit Voltage); Jsc (short-circuit photocurrent density); PCE (Power Conversion Efficiency); AVT (Average Visible Transmittance) (complete solar cell and solar cell without metal aluminium cathode).

Example 2

Preparation of a Perovskite-Based Semi-Transparent Solar Cell

The perovskite-based semi-transparent solar cell was obtained using the same process reported in Example 1, with the only difference deriving from the use of perovskite precursors and polyacrylic acid (PAA) at different concentrations.

For this purpose, lead iodide ($PbI_2$) (purity 99.9985%-Alfa Aesar) (350.5 mg-0.76 mmoles), methylammonium iodide (MAI) ($CH_3NH_3I$) (GreatCell Solar) (120.8 mg-0.76 mmoles) and polyacrylic acid (PAA) (weight average molecular weight ($M_w$)=1800 kDa) (Aldrich) (23.6 mg), were dissolved in anhydrous dimethyl sulfoxide (purity 99.9%-Aldrich) (1 ml), operating under stirring, at a temperature of 80° C., for 3 hours, obtaining a solution containing 30% by weight of perovskite precursors and 1.57% by weight of polyacrylic acid (PAA), i.e. 5% by weight of polyacrylic acid (PAA) with respect to the total weight of the other solid components (i.e. lead iodide ($PbI_2$)+methylammonium iodide (MAI) ($CH_3NH_3I$). The solution thus obtained was deposited on said layer based on a material useful for improving the wettability, by means of spin coating operating at a rotation speed equal to 12000 rpm (acceleration equal to 1000 rpm/s), for 60 seconds and the whole was subjected to thermal treatment (annealing), at 100° C., for 60 minutes. The thickness of the perovskite and polyacrylic acid (PAA) layer was found to be 101 nm.

The electrical characterisation of the perovskite-based semi-transparent solar cell obtained was carried out as described above: in Table 1, the characteristic parameters are reported as average values.

Example 3

Preparation of a Perovskite-Based Semi-Transparent Solar Cell

The perovskite-based semi-transparent solar cell was obtained using the same process reported in Example 1, with the only difference deriving from the use of perovskite precursors and polyacrylic acid (PAA) at different concentrations.

For this purpose, lead iodide ($PbI_2$) (purity 99.9985%—Alfa Aesar) (350.5 mg-0.76 mmoles), methylammonium iodide (MAI) ($CH_3NH_3I$) (GreatCell Solar) (120.8 mg-0.76 mmoles) and polyacrylic acid (PAA) (weight average molecular weight ($M_w$)=1800 Da) (Aldrich) (70.6 mg), were dissolved in anhydrous dimethylsulfoxide (purity 99.9%-Aldrich) (1 ml), operating under stirring, at a temperature of 80° C., for 3 hours, obtaining a solution containing 30% by weight of perovskite precursors and 4.31% by weight of polyacrylic acid (PAA), i.e. 15% by weight of polyacrylic acid (PAA) with respect to the total weight of the other solid components (i.e., lead iodide ($PbI_2$)+methylammonium iodide (MAI) ($CH_3NH_3I$). The solution thus obtained was deposited on said layer based on a material useful for improving the wettability, by means of spin coating operating at a rotation speed equal to 12000 rpm (acceleration equal to 1000 rpm/s), for 60 seconds and the whole was subjected to thermal treatment (annealing), at 100° C., for 60 minutes. The thickness of the perovskite and polyacrylic acid (PAA) layer was found to be 208 nm.

The electrical characterisation of the semi-transparent solar cell obtained was carried out as described above: in Table 1, the characteristic parameters are reported as average values.

Example 4

Preparation of a Perovskite-Based Semi-Transparent Solar Cell

The perovskite-based semi-transparent solar cell was obtained using the same process reported in Example 1, with the only difference deriving from the use of a different material to improve the wettability of the holes transport layer.

For this purpose, a solution of poly [9,9-bis(3'-(N,N-dimethyl)-N-ethylammonium-propyl-2,7-fluorene)-alt-2,7-(9,9-dioctylfluorene)]diiodide (PFN-I) (Aldrich) in methanol (purity 99.5%-Aldrich) at a concentration of 0.1 mg/ml, was deposited by spin coating operating at a rotation speed equal to 5000 rpm (acceleration equal to 1000 rpm/s), for 40 sec, then the whole was subjected to thermal treatment (annealing), at 100° C., for 5 minutes.

The electrical characterisation of the semi-transparent solar cell obtained was carried out as described above: in Table 1, the characteristic parameters are reported as average values.

Example 5

Preparation of a Perovskite-Based Semi-Transparent Solar Cell

The perovskite-based semi-transparent solar cell was obtained using the same process reported in Example 1, with the only difference deriving from the use of a different hole transport material.

For this purpose, a solution of poly [bis(4-butylphenyl)-bisphenylbenzidine] (Poly-TPD) (Aldrich) in chlorobenzene (purity 99.5%-Aldrich) at a concentration equal to 1.5 mg/ml, was deposited, through spin coating operating at a rotation speed equal to 4000 rpm (acceleration equal to 1000 rpm/s), for 60 seconds: the whole was subjected to heat treatment (annealing), at 110° C., for 30 minutes. The thickness of the layer based on a hole transport material (Hole Transport Layer—HTL) was found to be equal to 30 nm.

The electrical characterisation of the semi-transparent solar cell obtained was carried out as described above: in Table 1, the characteristic parameters are reported as average values.

Example 6

Preparation of a Perovskite-Based Semi-Transparent Solar Cell

The perovskite-based semi-transparent solar cell was obtained using the same process reported in Example 1, with the difference deriving from the use of a different hole transport material and from a different concentration of perovskite precursors.

Subsequently, after having deposited the layer of poly [(9,9-bis(3'-(N,N-dimethylamino) propyl)-2,7-fluorene)-alt-2,7-(9,9-dioctylfluorene)] (PFN), the layer of methylammonium lead iodide ($CH_3NH_3PbI_3$) and polyacrylic acid (PAA) was deposited by operating as follows. For this purpose, lead iodide ($PbI_2$) (purity 99.9985%-Alfa Aesar) (447.9 mg-0.97 mmoles), methylammonium iodide (MAI) ($CH_3NH_3I$) (GreatCell Solar) (155.1 mg-0.97 mmoles) and polyacrylic acid (PAA) (weight average molecular weight ($M_w$)=1800 Da) (Aldrich) (60.3 mg), were dissolved in anhydrous dimethylsulfoxide (purity 99.9%-Aldrich) (1 ml), operating under stirring, at a temperature of 80° C., for 3 hours, obtaining a solution containing 35% by weight of perovskite precursors and 3.4% by weight of polyacrylic acid (PAA), i.e. 10% by weight of polyacrylic acid (PAA) with respect to the total weight of the other solid components (i.e., lead iodide ($PbI_2$)+methylammonium iodide (MAI) ($CH_3NH_3I$). The solution thus obtained was deposited on the layer based on a material useful for improving the wettability [i.e. the layer of poly [(9,9-bis(3'-(N,N-dimethylamino) propyl)-2,7-fluorene)-alt-2,7-(9,9-dioctylfluorene)] (PFN)], by spin coating operating at a rotation speed equal to 5000 rpm (acceleration equal to 1000 rpm/s), for 20 seconds and the whole was subjected to heat treatment ("annealing"), at 100° C., for 15 minutes. The thickness of the perovskite and polyacrylic acid (PAA) layer was found to be 210 nm.

The electrical characterisation of the semi-transparent solar cell obtained was carried out as described above: in Table 1, the characteristic parameters are reported as average values.

TABLE 1

| Example | Photoactive layer (thickness - nm) | FF(1) (%) | Voc(2) (V) | Jsc(3) ($mA/cm^2$) | PCE(4) (%) | AVT(5a) (%) | AVT(5b) (%) |
|---|---|---|---|---|---|---|---|
| 1 | MAPI (30)(6) + PAA (10)(7) (182) | 67.6 | 1.16 | 17.89 | 14.03 | 25 | 37 |
| 2 | MAPI (30)(6) + PAA (5)(7) (101) | 69.8 | 1.15 | 13.58 | 10.9 | 32 | 41 |
| 3 | MAPI (30)(6) + HEC (15)(7) (208) | 60.2 | 1.14 | 17.19 | 11.8 | 21 | 29 |
| 4 | MAPI (30)(6) + PAA (10)(7) (195) | 65.5 | 1.10 | 18.3 | 13.2 | 24 | 35 |
| 5 | MAPI (30)(6) + PAA (10)(7) (171) | 70.3 | 1.17 | 17.5 | 14.4 | 27 | 38 |
| 6 | MAPI (35)(6) + PAA (10)(7) (210) | 69.1 | 1.12 | 19.2 | 14.9 | 21 | 28 |

(1)Fill Factor;

(2)Open Circuit Voltage;

(3)short-circuit photocurrent density;

(4)Power Conversion Efficiency;

(5a)Average Visible Transmittance (complete perovskite-based semi-transparent solar cell);

(5b)Average Visible Transmittance [complete perovskite-based semi-transparent solar cell without metallic aluminium cathode (Al)];

(6)methylammonium lead iodide [($CH_3NH_3$)$PbI_3$] [(in brackets % by weight of perovskite precursors (i.e., lead iodide ($PbI_2$) + methylammonium iodide (MAI) ($CH_3NH_3I$)];

(7)polyacrylic acid (PAA) (in brackets, % by weight of polyacrylic acid (PAA) with respect to the total weight of the other solid components [i.e., lead iodide ($PbI_2$) + methylammonium iodide (MAI) ($CH_3NH_3I$)].

For this purpose, a solution of poly [bis(4-butylphenyl)-bisphenylbenzidine] (Poly-TPD) (Aldrich) in chlorobenzene (purity 99.5%-Aldrich) at a concentration equal to 1.5 mg/ml, was deposited, through spin coating operating at a rotation speed equal to 4000 rpm (acceleration equal to 1000 rpm/s), for 60 seconds: the whole was subjected to heat treatment (annealing), at 110° C., for 30 minutes. The thickness of the layer based on a hole transport material (Hole Transport Layer—HTL) was found to be equal to 30 nm.

From the data reported in Table 1 it can be seen that the perovskite-based semi-transparent solar cell object of the present disclosure shows to have both a good power conversion efficiency (PCE) (i.e. PCE>10%) and a good average visible transmittance (AVT) (i.e. AVT>20%) (measured in the range of between 400 nm and 800 nm), said result being obtained without negatively affecting the remaining electrical properties, i.e. FF (Fill Factor), Voc (Open Circuit Voltage); Jsc (short-circuit photocurrent density) values.

The invention claimed is:

1. A perovskite-based semi-transparent photovoltaic cell comprising a perovskite layer comprising at least one polyacrylic acid in an amount greater than or equal to 3% by weight, with respect to the total weight of precursors of the perovskite layer, wherein the perovskite layer has an average visible transmittance greater than 20 percent measured in the range between 400 nm and 800 nm;

wherein the polyacrylic acid has a weight average molecular weight (Mw) equal to 1800 Da.

2. The perovskite-based semi-transparent photovoltaic cell according to claim 1, wherein said perovskite is selected from organometallic trihalides having general formula $ABX_3$ wherein:

A represents a monovalent organic cation; or A represents a monovalent inorganic cation; or mixtures thereof;

B represents a divalent metal cation; and

X represents a halide anion.

3. The perovskite-based semi-transparent photovoltaic cell according to claim 1, wherein said perovskite is selected from: methylammonium lead iodide ($CH_3NH_3PbI_3$), methylammonium lead bromide ($CH_3NH_3PbBr_3$), methylammonium lead chloride ($CH_3NH_3PbCl_3$), methylammonium lead iodide bromide ($CH_3NH_3PbI_xBr_{3-x}$), methylammonium lead iodide chloride ($CH_3NH_3PbI_xCl_{3-x}$), formamidinium lead iodide [$CH(NH_2)_2PbI_3$], formamidinium lead bromide [$CH(NH_2)_2PbBr_3$], formamidinium lead chloride [$CH(NH_2)_2PbCl_3$], formamidinium lead iodide bromide [$CH(NH_2)_2PbI_xBr_{3-x}$], formamidinium lead iodide chloride [$CH(NH_2)_2PbI_xCl_{3-x}$], methylammonium formamidinium lead iodide [$(CH_3NH_3)_x(CH(NH_2)_2)_{1-x}PbI_3$], methylammonium formamidinium lead bromide [$(CH_3NH_3)_x(CH(NH_2)_2)_{1-x}PbBr_3$], methylammonium formamidinium lead chloride [$(CH_3NH_3)_x(CH(NH_2)_2)_{1-x}PbCl_3$], methylammonium formamidinium lead iodide chloride [$(CH_3NH_3)_x(CH(NH_2)_2)_{1-x}PbI_{3-y}Cl_y$], methylammonium formamidinium lead iodide bromide [$(CH_3NH_3)_x(CH(NH_2)_2)_{1-x}PbI_{3-y}Br_y$], n-butylammonium lead iodide ($C_4H_{12}NH_3PbI_3$), tetra-butylammonium lead iodide ($C_{16}H_{36}NPbI_3$), n-butylammonium lead bromide ($C_4H_{12}NH_3PbBr_3$), tetra-butylammonium lead bromide ($C_{16}H_{36}NPbBr_3$), caesium lead iodide ($CsPbI_3$), rubidium lead iodide ($RbPbI_3$), potassium lead iodide ($KPbI_3$), caesium methylammonium lead iodide [$Cs_x(CH_3NH_3)_{1-x}PbI_3$], potassium methylammonium lead iodide [$K_x(CH_3NH_3)_{1-x}PbI_3$], caesium methylammonium lead iodide chloride [$Cs_x(CH_3NH_3)_{1-x}PbI_{3-y}Cl_y$], caesium formamidinium lead iodide [$Cs_x(CH(NH_2)_2)_{1-x}PbI_3$], caesium formamidinium lead bromide [$Cs_x(CH(NH_2)_2)_{1-x}PbBr_3$], caesium formamidinium lead iodide chloride [$Cs_x(CH(NH_2)_2)_{1-x}PbI_{3-y}Cl_y$], methylammonium tin iodide ($CH_3NH_3SnI_3$), methylammonium tin bromide ($CH_3NH_3SnBr_3$), methylammonium tin iodide bromide ($CH_3NH_3SnI_xBr_{3-x}$), formamidinium tin iodide [$CH(NH_2)_2SnI_3$], formamidinium tin iodide bromide [$CH(NH_2)_2SnI_xBr_{3-x}$], n-butylammonium tin iodide ($C_4H_{12}NH_3SnI_3$), tetra-butylammonium tin iodide ($C_{16}H_{36}NSnI_3$), n-butylammonium tin bromide ($C_4H_{12}NH_3SnBr_3$), tetra-butylammonium tin bromide ($C_{16}H_{36}NSnBr_3$), methylammonium tin lead iodide ($CH_3NH_3Sn_xPb_{1-x}I_3$), formamidinium tin lead iodide [$CH(NH_2)_2Sn_xPb_{1-x}I_3$], or mixtures thereof.

4. The perovskite-based semi-transparent photovoltaic cell according to claim 1, wherein said polyacrylic acid has general formula (I):

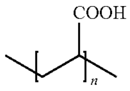

(I)

wherein n is an integer comprised between 10 and 60000.

5. The perovskite-based semi-transparent photovoltaic cell according to claim 1, comprising:

a glass substrate covered with a layer of transparent conductive oxide (TCO), fluorine-doped tin oxide ($SnO_2$:F) (FTO), or oxide of indium tin (ITO) which constitutes the anode;

a layer based on a hole transport material (Hole Transport Layer layer—HTL), a layer of poly[bis(4-phenyl(2,4,6-trimethylphenyl)amine (PTAA), a layer of poly[bis(4-butylphenyl)bisphenylbenzidine] (Poly-TPD), or a layer of a mixture of poly(3,4-ethylenedioxythiophene) and polystyrene sulfonate (PEDOT:PSS);

a photoactive layer comprising the perovskite layer of claim 1;

a layer based on an electron transport material (Electron Transport Layer—ETL);

optionally, a layer base on a hole blocking material (Hole Blocking Layer—HBL); and a metallic contact known as back contact which constitutes the cathode.

6. The perovskite-based semi-transparent photovoltaic cell according to claim 5, further comprising a layer based on a material useful for improving the wettability of the layer based on the hole transport material, a layer of poly[9,9-bis(3'-(N,N-dimethyl)-N-ethylammonium-propyl-2,7-fluorene)-alt-2, 7-(9,9-dioctylfluorene)]-diodide (PFN-I), or a layer of poly[9,9-bis(3'-(N,Ndimethyl)-N-ethylammonium-propyl-2, 7-fluorene)-alt-2, 7-(9,9-dioctylfluorene)] (PFN).

7. The perovskite-based semi-transparent photovoltaic cell according to claim 1, wherein the electrical energy generated by said at least one perovskite-based semi-transparent photovoltaic cell is transported using a system of wiring which is connected with said perovskite-based semi-transparent photovoltaic cell.

8. Use of a perovskite-based semi-transparent photovoltaic cell in accordance with claim 1 in: building integrated photo voltaic (BIPV); photovoltaic windows, greenhouses; photo-bioreactors; noise barriers; lighting engineering; design; advertising; or automobile industry.

9. A process for the preparation of a perovskite-based semi-transparent photovoltaic cell, the process including the following steps:

(a) preparing a glass substrate covered with a transparent conductive oxide (TCO) layer (anode), (b) depositing a layer based on a hole transport material (Hole Transport Layer—HTL) on the substrate obtained in said step (a), (c) optionally, depositing on the layer based on a hole transport material (Hole Transport Layer—HTL) obtained in said step (b) a layer based on a material useful for improving the wettability of the layer based on the hole transport material, (d) preparing a mixture comprising precursors of perovskite and at least one polyacrylic acid, said polyacrylic acid being present in said mixture in an amount greater than or equal to 3% by weight, with respect to the total weight of the perovskite precursors, (e) depositing the mixture obtained in said step (d) on the layer based on a hole transport material (Hole Transport Layer—HTL) obtained in said step (b), or on the layer based on a material useful for improving the wettability obtained in said step (c), obtaining a photoactive layer, (f) depositing a layer based on an electron transport material (Electron Transport Layer—ETL), on the photoactive layer obtained in said step (e), (g) optionally, depositing on the layer based on an electron transport material (Electron Transport Layer—ETL) obtained in said step (f), a layer based on a hole blocking material (Hole Blocking Layer—HBL), and (h) depositing a metal contact known as back contact which constitutes the cathode, on the layer based on an electron transport material (Electron Transport Layer—ETL) obtained in said step (f), or on the layer based on a hole blocking material (Hole Blocking Layer—HBL) obtained in said step (g);

wherein said steps (b), (c), (e), (f) and (g), are carried out at a temperature comprised between 20 and 115° C.

10. A process for the preparation of a perovskite-based semitransparent photovoltaic cell, the process including the following steps:

(a) preparing a glass substrate covered with a transparent conductive oxide (TCO) layer (anode), (b) depositing a layer based on a hole transport material (Hole Transport Layer—HTL) on the substrate obtained in said step (a), (c) depositing on the layer based on a hole transport material (Hole Transport Layer—HTL) obtained in said step (b) a layer based on a material useful for improving the wettability of the layer based on the hole transport material, (d) preparing a mixture comprising precursors of perovskite and at least one polyacrylic acid, said polyacrylic acid being present in said mixture in an amount greater than or equal to 3% by weight, with respect to the total weight of the perovskite precursors, (e) depositing the mixture obtained in said step (d) on the layer based on a material useful for improving the wettability obtained in said step (c), obtaining a photoactive layer, (f) depositing a layer based on an electron transport material (Electron Transport Layer—ETL), on the photoactive layer obtained in said step (e), (g) optionally, depositing on the layer based on an electron transport material (Electron Transport Layer—ETL) obtained in said step (f), a layer based on a hole blocking material (Hole Blocking Layer—HBL), and (h) depositing a metal contact known as back contact which constitutes the cathode, on the layer based on an electron transport material (Electron Transport Layer—ETL) obtained in said step (f), or on the layer based on a hole blocking material (Hole Blocking Layer—HBL) obtained in said step (g);

wherein said steps (b), (c), (e), (f) and (g), are carried out at a temperature comprised between 20 and 115° C.

* * * * *